(12) United States Patent
Kim

(10) Patent No.: US 6,292,816 B1
(45) Date of Patent: Sep. 18, 2001

(54) NONLINEAR EQUALIZING APPARATUS

(75) Inventor: Yung-soo Kim, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/225,505

(22) Filed: Jan. 6, 1999

(30) Foreign Application Priority Data

Jan. 7, 1998 (KR) .................................................. 98-199

(51) Int. Cl.$^7$ .................................................. G06F 17/10
(52) U.S. Cl. .................................................. 708/323
(58) Field of Search .................. 708/322–323; 375/232–236

(56) References Cited

U.S. PATENT DOCUMENTS

| | | | |
|---|---|---|---|
| 4,539,690 | 9/1985 | Speidel . | |
| 5,654,765 | * 8/1997 | Kim | ...................... 708/323 |
| 5,914,983 | * 6/1999 | Bowser et al. | ...................... 708/323 |
| 6,011,814 | * 1/2000 | Martinez et al. | ...................... 708/323 |

FOREIGN PATENT DOCUMENTS

| | | |
|---|---|---|
| 0538218 A1 | 10/1991 | (EP) . |
| 0808 046 A2 | 5/1996 | (EP) . |
| WO 92/10029 | 12/1991 | (WO) . |

* cited by examiner

Primary Examiner—Tan V. Mai
(74) Attorney, Agent, or Firm—Burns, Doane, Swecker & Mathis, L.L.P.

(57) ABSTRACT

A nonlinear equalizing apparatus used for a digital magnetic recording medium is provided. The nonlinear equalizing apparatus according to the present invention includes a linear filter for linear filtering the input value $r_k$, a pattern dependent filter including $2^{\tau+\nu}$ tap values selected by the respective patterns ($b_{k-n+v:k-n+1}, b_{k-n-1:k-n-\tau}$) of future v and past $\tau$ bit data transition absolute values and N taps $p_n(b_{k-n+v:k-n+1}, b_{k-n-1:k-n-\tau})$ for outputting the value obtained by multiplying the selected tap value with the current transition ($x_{k-n}$), and (wherein, $x_{k-n} = (a_{k-n} - a_{k-n-1})/2 \in \{-1, 0, 1\}$, $b_{k-n} = |x_{k-n}| \in \{0, 1\}$, $b_{k-n-1:k-n-\tau} = (b_{k-n-1}\, b_{k-n-2} \ldots b_{k-n-\tau})$, $b_{k-n+v:k-n+1} = (b_{k-n+v}\, b_{k-n+v-1} \ldots b_{k-n+1})$, n=0, 1, 2, . . . , N, and N is a predetermined integer not less than 1+v) a detector for obtaining an error value $e_k$ by a subsequent equation, with respect to all combinations of current and future data sequences $$e_k = \sum_m r_{k-m} f_m - \sum_n x_{k-n} p_n(b_{k-n+v:k-n+1}, b_{k-n-1:k-n-\tau})$$

(wherein, $f_m$ is the linear filter) and detecting current data assumed in the combination by which the minimum error square value is generated as the original data $a_k$.

According to the present invention, it is possible to effectively display the nonlinear distortion of the digital magnetic storing channel generated by the interaction between adjacent data and to remarkably reduce a modeling error compared with a conventional model in which the influence of the future bit cannot be considered, by displaying the nonlinear channel of a high density digital magnetic storing apparatus as transition pulses selected according to the pattern of the transition absolute value of the future v bits and the past $\tau$ bits.

10 Claims, 8 Drawing Sheets

NONLINEAR EQUALIZING APPARATUS

BACKGROUND OF THE INVENTION

1. Field of the Invention

The present invention relates to an equalizing apparatus, and more particularly, to a non-linear equalizing apparatus used for a digital magnetic recording medium.

2. Description of the Related Art

Nonlinearity becomes a serious problem as recording density increases in a digital magnetic recording medium such as a hard disk drive (HDD). The nonlinearity is generated due to interaction between adjacent transitions. A demagnetization field of a previously recorded transition shifts the position of a subsequently recorded transition and increases the width between transitions. The adjacent transitions operate to erase each other. As a result, the size of a reproduced signal is reduced. Such phenomenons are known as nonlinear transition shift (NLTS), a transition broadening, and a partial erasure respectively.

When data are to be recorded, some peripheral bits generate such a nonlinear distortion. However, an interference effect between signals in reproduced signals exists in many bits. Accordingly, the nonlinear distortion affects many bits. When a signal detector does not process the nonlinear distortion, data detection reliability deteriorates.

According to a conventional technology (U.S. Pat. No. 5,132,988), the nonlinear distortion is processed using a feedback RAM instead of a feedback filter. Since a RAM model for processing the nonlinear distortion models only the nonlinear distortion from past data, it is impossible to consider the interaction between current and future data.

Also, since the size of a RAM is doubled as the range of data filtered by a feedback portion increases by one bit in this equalizer, the amount of data which can be processed by the feedback portion is restricted by the size of the RAM.

The linearity and nonlinearity characteristics of a channel are shown by three pulses in a paper by W. Zeng and J. Moon ["A Practical Nonlinear Model for Magnetic Recording Channels", IEEE Trans. Magn., vol. 30, no. 6, pp. 4233–4235, November 1994]. The three pulses are an isolated transition response which is a transition response in the case that there is no transition between adjacent data and dibit responses which are transition responses in the case that there is a transition in a one bit past and there is a transition in a two bit past. The three pulses are obtained by measuring the reproduced signals.

However, a channel characteristic is not obtained from all the data sequences which may be generated but obtained by measuring a channel signal in an extremely restricted situation, in this model. As a result, this model does not provide a method of mathematically optimizing a model in order to heighten the reliability or obtaining the channel characteristic in a more general situation. Also, logic regulations for generating logic variables such as $Q_k$, $R_k$, ERA, and CHO required for operating the model are not mathematically induced but are created depending on the experience of the writers. The nonlinear equalizer in which the model provided by W. Zeng and J. Moon is used ["Decision feedback equalizer with pattern dependent dynamic threshold," IEEE Trans. Magn., vol. 32, no. 4, pp. 3266–3273, July 1996] includes all the restrictions and problems which the model has.

SUMMARY OF THE INVENTION

It is an object of the present invention to provide an adaptive nonlinear equalizing apparatus.

It is another object of the present invention to provide a pattern dependent filter of the above apparatus.

It is still another object of the present invention to provide an adaptive nonlinear equalizing method which can effectively process a nonlinear distortion generated by an interaction not only between adjacent past bits but also between current and future bit data.

In order to achieve the first object, there is provided a nonlinear equalizing apparatus for detecting original data $a_k$ from an input value $r_k$ obtained by reproducing data received through a transfer channel or recorded on a storing apparatus, comprising a linear filter for linear filtering the input value $r_k$, a pattern dependent filter including $2^{\tau+\nu}$ tap values selected by the respective patterns $(b_{k-n+\nu:k-n+1}, b_{k-n-1:k-n-\tau})$ of future $\nu$ and past $\tau$ bit data transition absolute values and N taps $p_n(b_{k-n+\nu:k-n+1}, b_{k-n-1:k-n-\tau})$ for outputting the value obtained by multiplying the selected tap value with the current transition $(x_{k-n})$, and (wherein, $x_{k-n}=(a_{k-n}-a_{k-n-1})/2\in\{-1, 0, \}$, $b_{k-n}=|x_{k-n}|\in\{0, 1\}$, $b_{k-n-1:k-n-\tau}=(b_{k-n-1}\ b_{k-n-2}\ \ldots\ b_{k-n-\tau})$, $b_{k-n+\nu:k-n+1}=(b_{k-n+\nu}\ b_{k-n+\nu-1}\ \ldots\ b_{k-n+1})$, n=0, 1, 2, ..., N, and N is a predetermined integer not less than 1+$\nu$) a detector for obtaining an error value $e_k$ by a subsequent equation, with respect to all combinations of current and future data sequences $$e_k = \sum_m r_{k-m} f_m - \sum_n x_{k-n} p_n(b_{k-n+\nu:k-n+1}, b_{k-n-1:k-n-\tau})$$

(wherein, $f_m$ is the linear filter) and detecting current data assumed in the combination by which the minimum error square value is generated as the original data $a_k$.

In order to achieve the second object, there is provided a pattern dependent filter, comprising the 0th through the Nth filter taps including $2^{\tau+1}$ tap values selected by the pattern $(b_{k+1-n}, b_{k-1-n:k-\tau-n})$ of a future and past $\tau$ bit data transition absolute values and adaptively renewed by the error value $e_{k-3}$, for multiplying the selected tap value with the current transition $x_{k-n}$ and outputting the multiplication result, wherein $a_k$ is original data detected by the nonlinear equalizing apparatus, $x_{k-n}=(a_{k-n}-a_{k-n-1})/2\in\{-1, 0, \}$, $b_{k-n}=|x_{k-n}|\in\{0, 1\}$, $b_{k-n-1:k-n-\tau}=(b_{k-n-1}\ b_{k-n-2}\ \ldots\ b_{k-n-\tau})$, n=0, 1, 2, ..., N, and N is a predetermined integer not less than 2, wherein the respective filter taps comprises a buffer list for storing $2^{\tau+1}$ tap values, tap value selecting means for selecting one among $2^{\tau+1}$ tap values output from the buffer list by the pattern $(b_{k+1-n}, b_{k-1-n:k-\tau-n})$ of future one and past $\tau$ bit data transition absolute values, a current transition multiplier for multiplying the tap value selected by the tap value selecting means with the current transition $x_{k-n}$ and outputting the result, and a tap value renewing means for renewing the tap value by adding the tap value selected by the pattern $(b_{k-2-n}, b_{k-4-n:k-3-\tau-n})$ of the past one and future $\tau$ bit data transition absolute values from a reference time when the reference time is k−3−n.

In order to achieve the third object, there is provided a method of detecting original data $a_k$ from an input value $r_k$ obtained by reproducing data received through a transfer channel or recorded on a storing apparatus, comprising the steps of obtaining $$\sum_n r_{k-n} f_n$$

by linear filtering the input value $r_k$, obtaining $$z_k = \sum_n r_{k-n} f_n - \sum_{n=2}^{N} x_{k-n} p_n(b_{k-n+1}, b_{k-n-1:k-n-\tau})$$

from already known data when a filter tap including $2^{\tau+1}$ tap values selected by the pattern $(b_{k+1-n}, b_{k-1-n:k-\tau-n})$ of the future one and past $\tau$ bit data transition absolute values from a reference time when the reference time is k-n for multiplying the selected tap value with the current transition $x_{k-n}$ is $p_n(b_{k-n+1}, b_{k-n-1:k-n-\tau})$, wherein $x_{k-n}=(a_{k-n}-a_{k-n-1})/2 \in \{-1, 0, 1\}$, $b_{k-n}=|x_{k-n}| \in \{0, 1\}$, $b_{k-n-1:k-n-\tau}=(b_{k-n-1} \ b_{k-n-2} \cdots b_{k-n-\tau})$, n=0, 1, 2, . . . , N, and N is a predetermined integer not less than $2^v$, obtaining an intermediate value $T_k$ between the output value of the filter tap $p_1$ and $p_0$ when the transition is continuously generated in the current and future one bit ($b_k=b_{k+1}=1$) and the output value of the filter tap $p_1$ and $p_0$ when the transition is not currently generated, and detecting the original data $a_k$ by determining $a_k$ as +1 when $z_k-T_k$ is equal to or greater than 0 and as −1 when $a_k$ is less than 0. Also, there is a method of detecting original data $a_k$ from an input value $r_k$ obtained by reproducing data received through a transfer channel or recorded on a storing apparatus, comprising the steps of obtaining $$\sum_n r_{k-n} f_n$$

by linear filtering the input value $r_k$, obtaining $$z_k = \sum_n r_{k-n} f_n - \sum_{n=2}^{N} x_{k-n} p_n(b_{k-n+1}, c_{k-n}, b_{k-n-1:k-n-\tau})$$

from already known data when a filter tap including $2^{\tau+2}$ tap values selected by the pattern $(b_{k+1-n}, c_{k-n}, b_{k-1-n:k-\tau-n})$ of the future one, current one, and past $\tau$ data transition absolute values from a reference time when the reference time is k-n for multiplying the selected tap value with the current transition $x_{k-n}$ is $p_n(b_{k-n+1}, c_{k-n}, b_{k-n-1:k-n-\tau})$, wherein, $x_{k-n}=(a_{k-n}-a_{k-n-1})/2 \in \{-1, 0, 1\}$, $b_{k-n}=|x_{k-n}| \in \{0, 1\}$, $b_{k-n-1:k-n-\tau=(bk-n-1} \ b_{k-n-2} \cdots b_{k-n-\tau})$, $c_{k-n}$ equals to 1 when $a_k>0$ and equals 0 in the other cases, n=0, 1, 2, . . . , N, and N is a predetermined integer not less than $2^v$, obtaining an intermediate value $T_k$ between the output value of the filter tap $p_1$ and $p_0$ when the transition is continuously generated in the current and future one bit ($b_k=b_{k+1}=1$) and the output value of the filter tap $p_1$ and $p_0$ when the transition is not currently generated, and detecting the original data $a_k$ by determining $a_k$ as +1 when $z_k-T_k$ equals to or is larger than 0 and as −1 when $a_k$ is less than 0.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Figure 1:
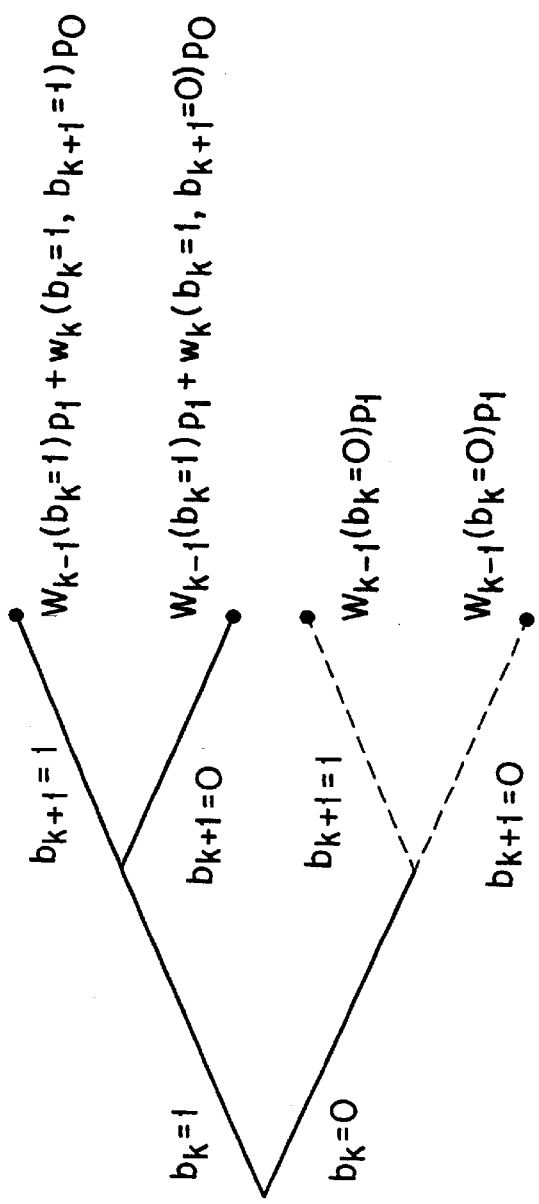
FIG. 1 shows a search tree with respect to current and future data transition absolute values when v=1.

A theory on which the present invention is based will be described hereinafter.

Processes of obtaining an equalizer error $e_k$ according to the present invention are as follows.

It is assumed that a binary data sequence is $a_k$ ($a_k$ is +1 or −1) and that a sample signal obtained by recording $a_k$ on a disk and reproducing $a_k$ or a sample signal received through a transfer channel is $r_k$. $r_k$ is filtered by a finite impulse response filter (FIR) $f_n$. An target signal is generated by the overlapping the filtered $r_k$ with pulse $p_n(\bullet)$ which vary according to the data patterns. Then, the difference between $r_k$ filtered by $f_n$ and the target signal is the equalizer error value $e_k$.

$$e_k = \sum_{n=-L_0}^{L_1} r_{k-n} f_n - \sum_{n=-N_0}^{N_1} x_{k-n} p_n(b_{k-n+v:k-n+1}, b_{k-n-1:k-n-\tau}) \quad (1)$$

wherein, $x_k=(a_k-a_{k-1})/2=-1$ represents the −ve transition of data $x_k=(a_k-a_{k-1})/2=0$ means that there is no transition of data. $x_k=(a_k-a_{k-1})=+1$ represents the +ve transition of data. $b_k=|x_k|=1$ means that there is an occurrence of a transition. $b_k=|x_k|=0$ means that there is no occurrence of a transition. $b_{k-1:k-\tau}$ represents $\tau$bits data set ($b_{k-1} \ b_{k-2} \cdots b_{k\tau}$) and a pulse $p_n(b_{k-n+v:k-n+1}, b_{k-n-1:k-n-\tau})$ has a value which varies according to the states of the transition of future v bits $b_{k-n+v:k-n+1}$ and the transition of past $\tau$ bits $b_{k-n-1:k-n-\tau}$ in the respective samples n.

A method of obtaining current data $a_k$ using an equalizer error value obtained by Equation 1 is as follows. After obtaining the square $e_k^* e_k$ of an output error with respect to all possible combinations of current and future $N_0+v$ data, the value of the current data assumed in the case of obtaining a minimum value is searched and is determined as the value of the current data $a_k$.

$$a_k = \begin{cases} 1 & \text{if } \min_{a_{k:k+N_0+v}} e_k^2 = \min_{a_{k+1:k+N_0+v}} e_k^2 \mid a_k = 1 \\ -1 & \text{if } \min_{a_{k:k+N_0+v}} e^2{}_k = \min_{a_{k+1:k+N_0+v}} e_k^2 \mid a_k = -1 \end{cases} \quad (2)$$

The pulse which varies according to data patterns can be represented as follows using a pattern state value $s_k$.

$$p_n(b_{k-n+v:k-n+1}, b_{k-n-1:k-n-\tau}) = \sum_{m=0}^{M-1} \delta(m - s_{k-n}) p_n(m) \quad (3)$$

$$= i_{k-n}^t p_n$$

wherein, $\delta(m-s_{k-n})$ is a delta function, which has a value of 1 when m is equal to $s_{k-n}$ and a value of 0 when m is not equal to $s_{k-n}$.

$$M = 2^{\tau+v} \quad (4)$$

$$s_{k-n} = \sum_{m+1}^{v} b_{k-n+m} 2^{\tau+m-1} + \sum_{m=1}^{\tau} b_{k-n-m} 2^{\tau-m} \quad (5)$$

$$i_{k-n} = [\delta(s_{k-n})\delta(s_{k-n}-1) \ldots \delta(s_{k-n}-M+1)]^t \quad (6)$$

$$p_n = [p_n(0) p_n(1) \ldots p_n(2^{\tau+v}-1)]^t \quad (7)$$

Equation 3 represents the pulse $p_n(b_{k-n+v:k-n+1}, b_{k-n-1:k-n-\tau})$ as the multiplication of two vectors of size M with each other. Equation 1 is represented as follows using Equation 3.

$$e_k = r_k^t f - \sum_{n=-N_0}^{N_1} x_{k-n} i_{k-n}^t P_n \quad (8)$$

$$e_k = r_k^t f - \sum_{n=-N_0}^{N_1} w_{k-n} p_n \quad (9)$$

$$e_k = r_k^t f - w_k p \quad (10)$$

$$w_{k-n} = x_{k-n} i_{k-n}^t \quad (11)$$

$$w_k = [w_{k+N_0} w_{k-1+N_0} \ldots w_{k-N_1}] \quad (12)$$

$$p = [p_{-N_0}^t p_{1-N_0}^t \ldots p_{N_1}^t]^t \quad (13)$$

For example, in a state in which $s_{k-n}$ is equal to 0, transitions are not generated in future v bits and past $\tau$ bits on the basis of the current data $a_{k-n}$. When an optional transition pattern $m_0$ is selected and $p_0(m_0)$ which is a pulse center tap (n=0) is designated to be 1, Equation 10 can be simultaneously omtimized with respect to the filter $f_n$ and the pulse $p_n(\bullet)$.

$$e_k = r_k^t f - w_k' p' - w_k(m_0) p_0(m_0) \quad (14)$$

$$= y_k^t f - w_k(m_0)$$

wherein, $p_0(m_0) = 1$.

$$y_k = [r_k^t - w_k']^t \quad (15)$$

$$f = \begin{vmatrix} f \\ p' \end{vmatrix} \quad (16)$$

wherein, p' is a vector obtained by erasing $p_0(m_0)$ from p. $w_k'$ Is a vector obtained by erasing $w_k(m_0)$ from $w_k$.

The optimal filter and pulse for minimizing an error square mean are obtained as follows.

$$f_0 = E\{y_k y_k^t\}^{-1} E\{y_k w_k(m_0)\} \quad (17)$$

Processes of adaptively obtaining the optimal filter and pulse are as follows.

$$f = f - \mu e_k y_k \quad (18)$$

This will be described in more detail as follows.

$$f_n = f_n - \mu e_k r_{k-n}, n = -L_0, \ldots, L_1 \quad (19)$$

$$p_n(i) = p_n(i) + \mu e_k x_{k-n} \delta(s_{k-n} - i),$$

$$n = -N_0, \ldots, N_1, i = 0, \ldots, 2^{\tau+1} - 1 \quad (20)$$

wherein, $p_0(m_0) = 1$.

According to Equation 2, in order to detect data by a nonlinear equalizer, an output error square is to be obtained with respect to current and future ($N_0$+v) and the value of $a_k$ having a minimum value is to be searched. However, when the value of ($N_0$+v) is great, these detecting processes are very complicated. Therefore, it is necessary to find a simpler method.

In the case in which $N_0=0$ and $v=1$ so that a pulse has only current and past signal values, the filter $f_n$ and the pulse $p_n(\bullet)$ operate in a similar way to the feedforward filter and the feed back filter of a decision-feedback equalizer (DFE). However, since the pattern $s_k$ of the pulse requires the value of future data, a search for the future data is necessary. Equation 9 can be represented as follows.

$$e_k = r_k^t f - \sum_{n=2}^{N_1} w_{k-n} p_n - \sum_{n=0}^{l} w_{k-n} p_n \quad (21)$$

$$= z_k - \sum_{n+0}^{l} w_{k-n} p_n$$

$$z_k = r_k^t f - \sum_{n=2}^{N_1} w_{k-n} p_n \quad (22)$$

$z_k$ can be obtained since past data is already known. Therefore, the current data $a_k$ is obtained by obtaining the error squares of Equation 21 with respect to all combinations current bit and one future bit can have and determining the $a_k$ value which is required for generating the minimum error square value as the value of the current bit. FIG. 1 shows a search tree for detecting data when n=1.

When n=1, data detecting processes can be simplified as follows. When the past transition $b_{k-n}$ (n>0) is already known, there are four transition patterns ($b_k$, $b_{K+1}$) to be considered in Equation 21, i.e., (0, 0), (0, 1), (1, 0), and (1, 1). However, since $w_{k-n} = x_{k-n} i_{k-n}^t$, when $b_k=0$, $w_k$ is always 0 regardless of $b_{k+1}$. Thus, $w_k(b_k=0)=0$. The transitions of the adjacent future bits generate a partial erasure phenomenon, thus reducing the size of the transition pulse of the current bit.

$$|w_k(b_k=1, b_{k+1}=1) p_0| \leq |w_k(b_{k-1}, b_{k+1}=0) p_0| \quad (23)$$

The value of the current bit is always determined between a case in which $b_k=0$ and a case in which $b_k=b_{k+1}=1$. A center point between the case in which $b_k=0$ and the case in which $b_k=b_{k+1}=1$ is as follows.

$$T_k = \frac{1}{2}\{w_{k-1}(b_k=0)p_1 + w_{k-1}(b_k=1)p_1 + w_k(b_k=b_{k+1}=1)p_0\} \quad (24)$$

The value of the current bit is easily detected by a threshold detector.

$$a_k = \begin{cases} +1, & \text{if } z_k - T_k \geq 0 \\ -1, & \text{otherwise} \end{cases} \quad (25)$$

wherein, $$z_k = r_k^t f - \sum_{n+2}^{N_1} w_{k-n} p_n$$

$$T_k = \frac{1}{2}\{w_{k-1}(b_k=0)p_1 + w_{k-1}(b_k=1)p_1 + w_{k-1}(b_k=b_{k+1}=1)p_0\}$$

When a signal is reproduced by a magneto resistive MR head, the signal has different characteristics according to a positive direction or a negative direction. In the present invention, it is possible to consider the characteristic of the signal which varies according to the directions by adding the state of the current data to the pattern of the pulse. Namely, the pulse is defined as $p_n(b_{k-n+v:k-n+1}, c_k, b_{k-n-1:k-n-\tau})$ and variables $c_k$, M, and $s_k$ are defined as follows.

$$c_k \begin{cases} 1, & \text{if } a_k > 0 \\ 0, & \text{otherwise} \end{cases} \quad (26)$$

$$M = 2^{\tau+v+1} \quad (27)$$

$$s_{k-n} = c_{k-n} 2^\tau + \sum_{m=1}^{v} b_{k-n+m} 2^{\tau+m} + \sum_{m+1}^{\tau} b_{k-n-m} 2^{\tau-m} \quad (28)$$

The other equations are the same as those mentioned before. The $c_k$ value is necessary in the 0th tap. However, when it is assumed that $b_k=1$, a circuit is constructed using a characteristic that the $c_k$ value is equal to the complement of the $C_{k-1}$ value.

Figure 2:
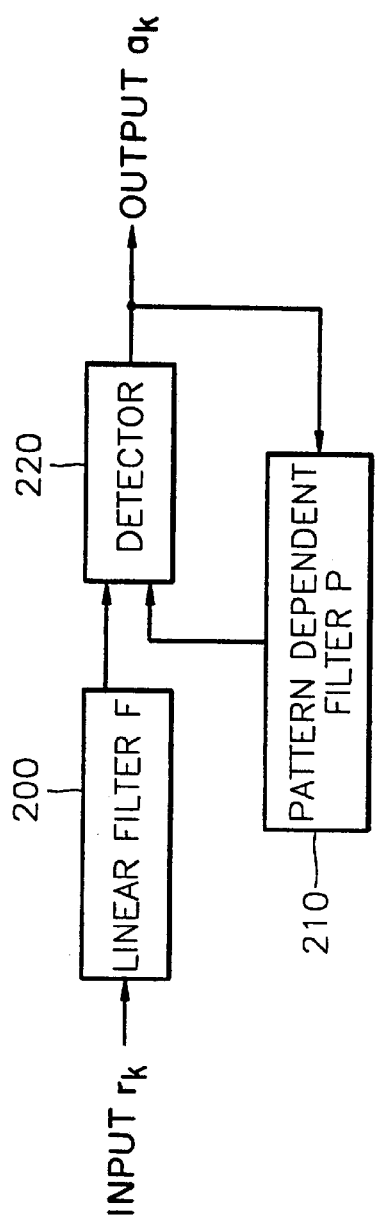
FIG. 2 is a block diagram of a nonlinear equalizer according to the present invention including a filter having a filter tap value which varies according to a data pattern containing future v data and past $\tau$ data.

FIG. 2 is a block diagram of a nonlinear equalizer for detecting binary data $a_k$ by the method of Equation 2 using the error value defined in Equation 1.

After processing the received input value $r_k$ by a linear filter 200, data previously detected by a pattern dependent filter 210 having different tap values according to past $s$ and future $v$ bits data pattern are filtered. An error value is obtained by a detector 220 by subtracting the output value of the pattern dependent filter 210 from the output value of the linear filter 200. The error values of Equation 1 with respect to all combinations of current and future data which are not detected yet are obtained. The detector 220 obtains $a_k$ for generating the minimum error square value as shown in Equation 2 among the error values of the respective combinations and determines it as final output data.

At this time, $a_k$ has the value of +1 or −1 in Equation, however, has the value of 1 or 0 in a circuit.

Hereinafter, the case in which the pattern dependent filter has different tap values according to future one and past $\tau$ bits data pattern will be described as a preferred embodiment of the present invention.

Figure 3:
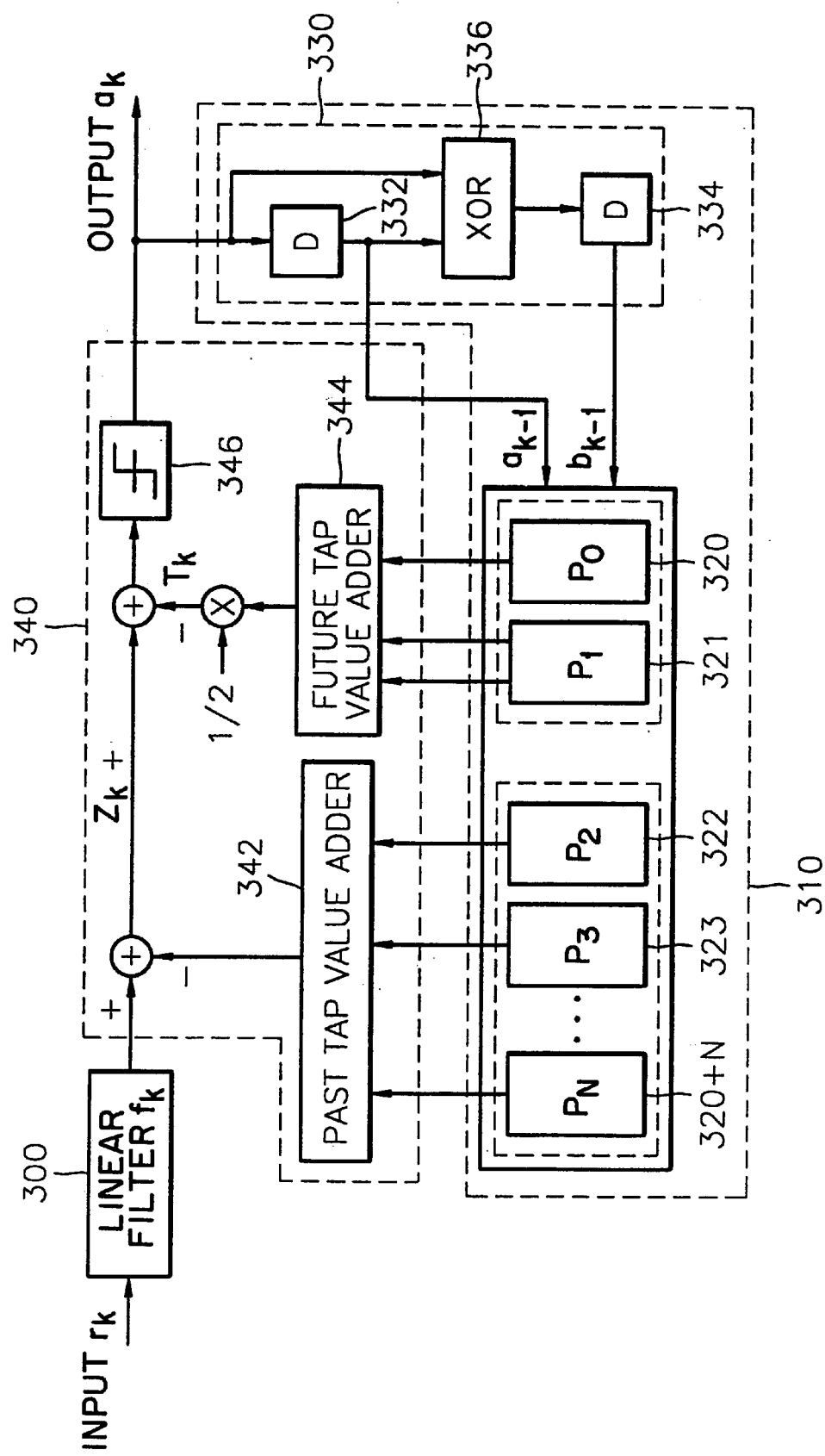
FIG. 3 is a block diagram of the nonlinear equalizer according to the present invention including a filter having a filter tap value which varies according to a data pattern containing future one data and the past $\tau$ data.

According to FIG. 3, processes of obtaining the current data $a_k$ according to Equation 25 are as follows in an embodiment of the present invention. In the present embodiment, a pattern dependent filter 310 includes a plurality of filter taps, i.e., 0th through Nth filter taps $P_0$ through $P_N$ 320 through 320+N and a transition calculator 330. A detector 340 includes a past tap value adder 342, a future tap value adder 344, and a threshold value detector 346.

The past tap adder 342 adds the output values of the second filter tap 322 through the Nth filter tap 320+N to each other. The future tap adder 344 adds the output value of the 0th filter tap 320 to that of the first filter tap 321.

$z_k$ of Equation 22 is obtained by subtracting the output value of the past tap value adder 332 from the input value $r_k$ filtered by the linear filter 300. $T_k$ of Equation 24 is obtained by multiplying ½ by the output value of the future tap value adder 334.

The threshold value detector 346 detects the current data $a_k$ by detecting a threshold value on the basis of 0 with respect to the signal obtained by subtracting $T_k$ from $z_k$ as shown in FIG. 25.

At this time, $b_k$ is defined as $|(a_k - a_{k-1})/2|$ in Equation 1. However, $b_k$ is obtained by performing an XOR operation on $a_k$ and $a_{k-1}$ in logic circuits. Namely, the transition calculator 330 obtains $a_{k-1}$ by delaying $a_k$ by one clock cycle by the first delaying means 332, $b_k$ by performing an XOR operation on $a_k$ and $a_{k-1}$ by an XOR gate 336, and $b_{k-1}$ by delaying $b_k$ by one clock cycle by the second delaying means 334. $a_{k-1}$ and $b_{k-1}$ are used by the 0th filter tap 320 through the Nth filter tap 320+N.

According to FIG. 4, processes of obtaining the error value of the equalizer are as follows in the above embodiment. The processes are realized by a pipeline method.

The two output values $w_{k-1}(b_k=0)p_1$ and $w_{k-1}(b_k=1)p_1$ of the first filter tap 321 are respectively delayed by one clock cycle by being stored in a buffer 401 and a buffer 402. The first filter tap value selector 410 selects $w_{k-1}(b_k=1)p_1$ delayed by one clock cycle when $b_{k-1}$ is 1 and $w_{k-1}(b_k=0)p_1$ delayed by one clock cycle when $b_{k-1}$ is 0.

The two outputs $w_k(b_k=1, b_{k+1}=1)p_0$ and $w_k(b_k=1, b_{k-1}=0)p_0$ the 0th filter tap 320 are respectively delayed by two clock cycles by being sequentially stored in buffers 403 and 404 and buffers 405 and 406. Then, the second filter tap value selector 420 selects $w_k(b_k=1, b_{k+1}=1)p_0$ delayed by two clock cycles when $b_{k-1}$ is 1 and $w_k(b_k=1, b_{k+1}=0)p_0$ delayed by two clock cycles when $b_{k-1}$ is 0. A third filter tap value selector 430 selects the output value of the second filter tap value selector 420 when $b_{k-2}$ is 1 and 0 when $b_{k-2}$ is 0.

$z_k$ is delayed by one clock cycle by being stored in a buffer 407 and become $z_{k-1}$. A first error value adder 440 subtracts the output value of the first filter tap value selector 410 from $z_{k-1}$. The output value of a first error value adder 440 is delayed by one clock cycle by being stored in the buffer 408. A second error value adder 450 subtracts the output value of the third error value selector 430 from the output value of the buffer 408. The output value of the second error value adder 450 is delayed one clock cycle by being stored in the buffer 409 and becomes an error value $e_{k-3}$ delayed by three clock cycles.

Figure 5:
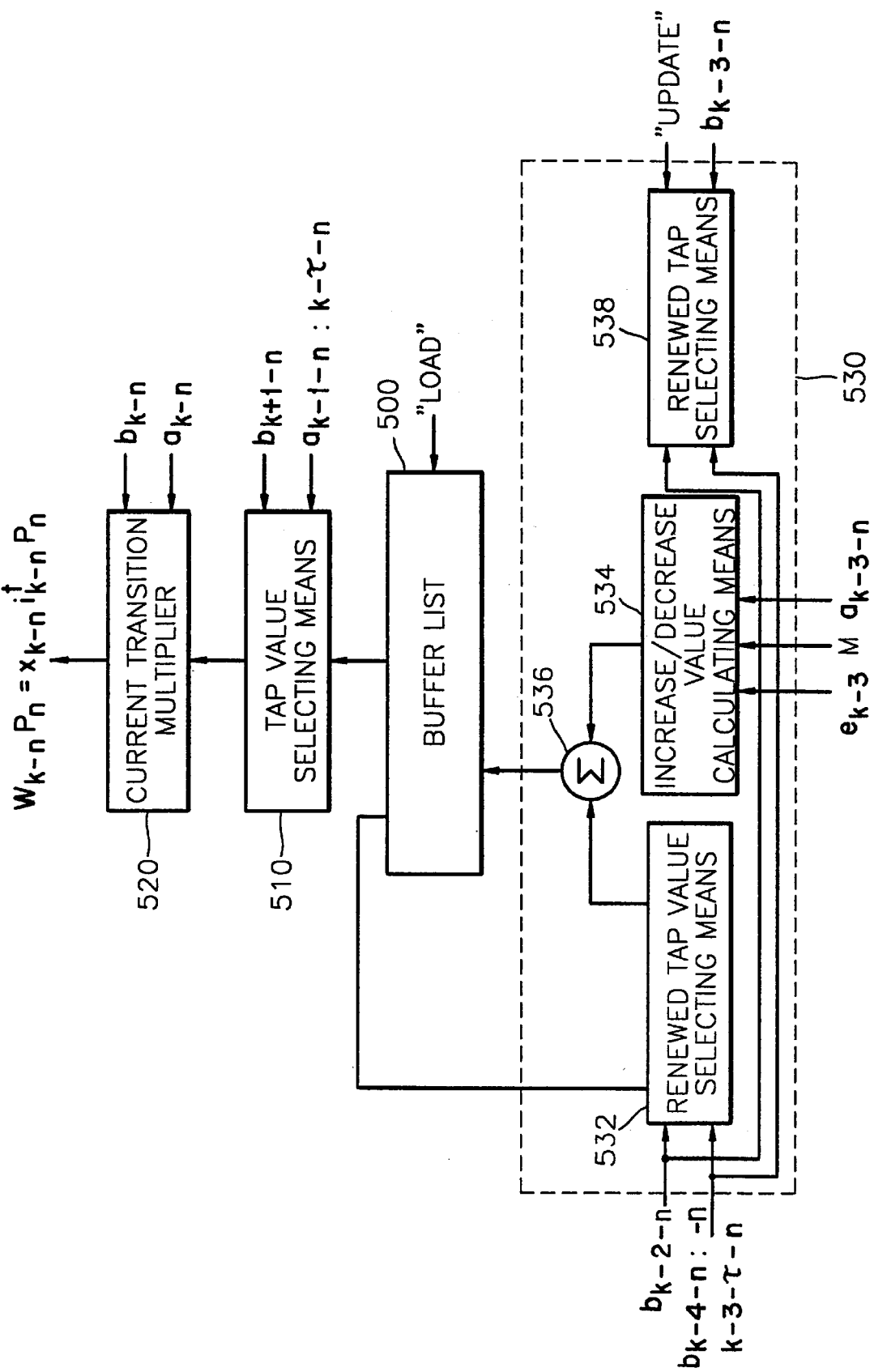
FIG. 5 is a block diagram showing the structure of a pattern dependent filter of a nonlinear equalizing apparatus according to the present invention.

FIG. 5 shows the structure of one among the filter taps included in the pattern dependent filter of the nonlinear equalizer according to the present invention. The filter tap according to the present invention includes a buffer list 500, a tap value selecting means 510, a current transition multiplier 520, and a tap value renewing means 530.

The buffer list 500 includes $2^{\tau+1}$ buffers for storing $2^{\tau+1}$ tap values selected by pattern $(b_{k+1-n}, b_{k-1-n:k-\tau-n})$ of future one and past $\tau$ data transition absolute values from a reference time when the reference time is k−n and adaptively renewed by the error value $e_{k-3}$.

The tap value selecting means 510 selects one among $2_{\tau+1}$ tap values output from the buffer list 500 by the pattern $(b_{k+1-n}, b_{k-1-n:k-\tau-n})$ of the future one and past τ data transition absolute values.

The current transition multiplier 520 multiplies the tap value selected by the tap value selecting means 510 with the current transition $x_{k-n}$ and outputs the result.

The tap value renewing means 530 includes a renewed tap value selecting means 532, an increase/decrease value calculating means 534, a renewed tap value calculator 536, and a renewed tap selecting means 538. Here, the reference time is k−3−n.

The renewed tap value selecting means 532 selects one among $2^{\tau+1}$ tap values output from the buffer list 500 by the pattern $b_{k-2-n}, b_{k-4-n:k-3-\tau-n})$ of the future one and past τ data transition absolute values from the reference time. The increase/decrease value calculating means 534 inputs a step size μ, current data value $a_{k-3-n}$, and the error value $e_{k-3}$ delayed by three clock cycles and calculates the increased and reduced value $\mu x_{k-3-n} e_{k-3}$.

The renewed tap value calculator 536 calculates the renewed tap value by adding the tap value selected by the renewed tap value selecting means 532 to the value calculated by the increase/decrease value calculating means 534 and stores the renewed tap value in the buffer of the buffer list 500 selected by the renewed tap selecting means 538.

The respective buffers included in the buffer list 500 includes a first buffer selector for selecting either the output of the buffer or the output value of the renewed tap value calculator 536 under the control of the renewed tap selecting means 538 and a second buffer selector for selecting either the output value of the first buffer selector or the initial value of the first buffer selector by a 'LOAD' control signal.

According to FIG. 6, the structure of an embodiment of an nth filter tap $P_n$ into (n=2 through N) having different tap values according to data patterns is as follows. The nth filter tap $P_n$ outputs the value $w_{k-n}p_n$. Here, the current time is set on the basis of k−n.

A buffer $p_n(i)$ (i=0, 1, . . . , $2^{\tau+1}-1$) stores the tap values with respect to the respective patterns. This value is designated as the initial value $p_n^0(i)$ (i=0, 1, . . . , $2^{\tau+1}-1$) when the control signal "LOAD" is turned on. Reference numerals 600 and 605 respectively denote a 0th buffer and a $2^{\tau+1}-1$th buffer.

In the present embodiment, the tap value selecting means 510 includes a lower tap value selecting multiplexer 610, an upper tap value selecting multiplexer 615, and a tap value selector 620.

The low tap value selecting multiplexer 610 selects one among lower $2^\tau$ tap values $p_n(i)$ (i=0, 1, , . . . , $2^\tau-1$)by the pattern $b_{k-1-n:k-\tau-n}$ of the past τ bit transition absolute value. The upper tap value selecting multiplexer 615 selects one among the uppers $2^\tau$ tap values $p_n(i)$ (i=$2^\tau$, . . . , $2^\tau-1$) by the pattern $b_{k-1-n:k-\tau-n}$ of the past τ bit transition absolute values.

The output value of the lower tap value selecting multiplexer 610 relates to the tap value when $b_{k+1-n}$=0. The output value of the upper tap value selecting multiplier 615 relates to the tap value when $b_{k+1-n}$=1. Therefore, the tap value selector 620 selects either the output value of the lower tap value selecting multiplexer 610 or that of the upper tap value selecting multiplexer 615. The result corresponds to the operation $i_{k-n}'p_n$ of Equation 3.

In the present embodiment, the current transition multiplier 520 of FIG. 5 includes a code selector 625 and a current transition presence selector 630.

The code selector selects the output value of the tap value selector 620 when $a_{k-n}$ is 1 and the value obtained by multiplying the output value of the tap value selector 620 with −1 when $a_{k-n}$ is 0. This process is the same as the process of multiplying $x_{k-n}$ with the output value of the tap value selector 620 when it is assumed that be $b_{k-n}$=1. Then, the current transition presence selector 630 selects either the output value of the code selector 625 or 0 according to $b_{k-n}$ and outputs the selected value.

Therefore, the code selector 625 and the current transition presence selector 630 perform the same operation as that of multiplying the output value $i_{k-n}'p_n$ of the tap value selector 620 with $x_{k-n}$. As a result, the output value of the current transition presence selector 630 is $w_{k-n}p_n = x_{k-n}i_{k-n}'p_n$, which is the output value of the nth filter tap $P_n$.

Figure 4:
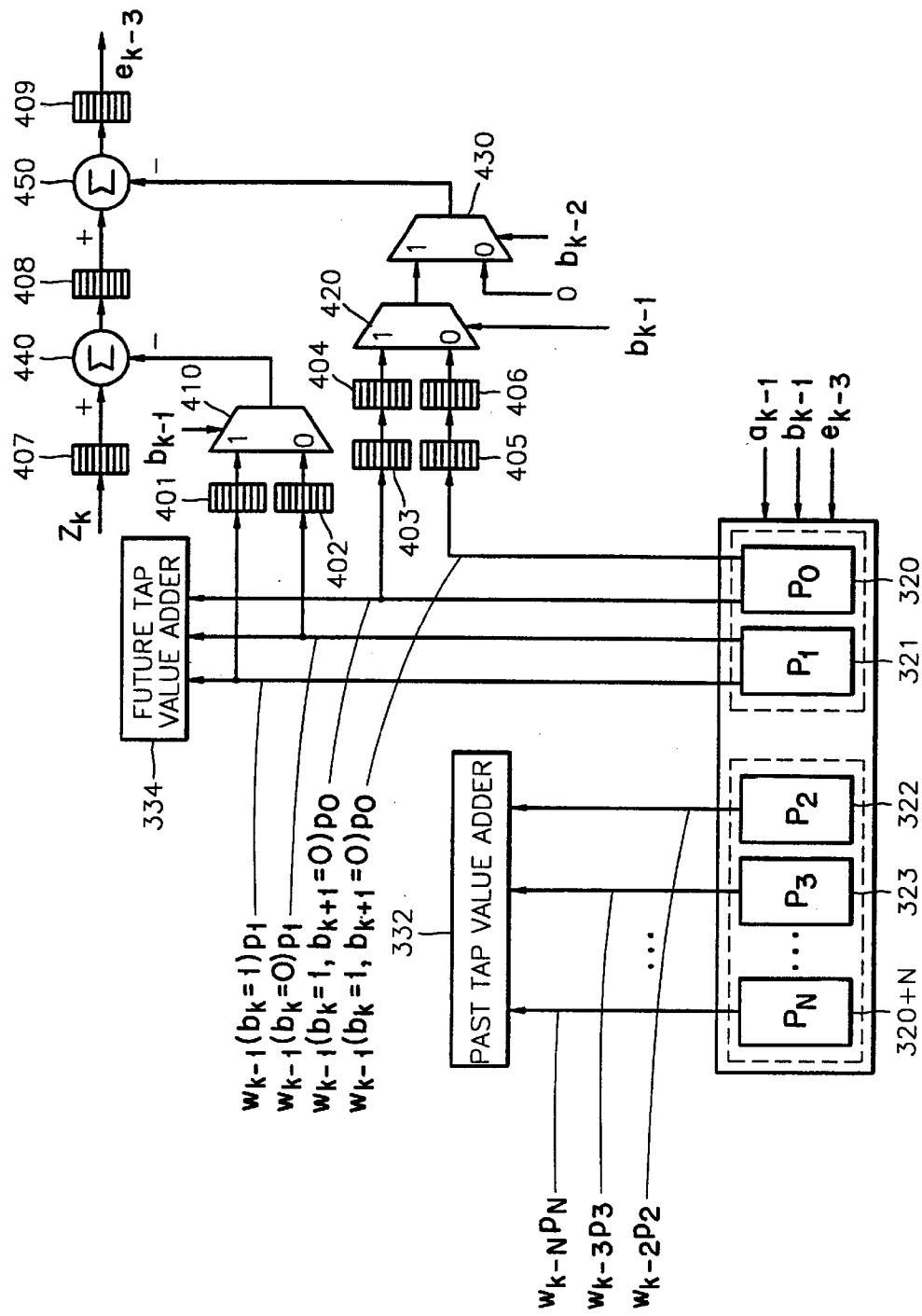
FIG. 4 is a block diagram of an error value calculator for the nonlinear equalizer obtaining an error value by a pipeline method.

The nth filter tap $P_n$ renews the tap value using the renewed error value $e_{k-3}$ as described in FIG. 4. The renewal process is based on Equation 20. In this process, the reference time is k−3−n.

The renewed tap value selecting means 635 is realized by a multiplexer and selects one among the output values of the buffers $p_n(i)$ (i=0, 1, . . . , $2^{\tau+1}-1$) by the future one transition $b_{k-2-n}$ and the past τ bit transition $b_{k-4-n:k-3-\tau-n}$. The increased and reduced value calculating means 640 obtains $\mu a_{k-3-n}e_{k-3}$ by inputting $a_{k-3-n}$, μ, and the error value $e_{k-3}$. The renewed tap value calculator 645 which is a kind of adder, adds the output value of the renewed tap value selecting means 635 to $\mu a_{k-3-n}e_{k-3}$.

The renewed tap selecting means 650 which is realized by a demultiplexer outputs 1 only to one output terminal selected $b_{k-2-n}$ and $b_{k-4-n:k-3-\tau-n}$ among $2^{\tau+1}$ output terminals and outputs 0 to the remaining $2^{\tau+1}-1$ output terminals. Namely, the renewed tap selecting means 650 selects one among $2^{\tau+1}$ buffers $p_n(i)$ (i=0, 1, . . . , $2^{\tau+1}-1$) according to $b_{k-2-n}$ and $b_{k-4-n:k-3-\tau-n}$. When a control signal "UPDATE" is high and the $b_{k-3-n}$ value is 1, the output value of the renewed tap value calculator 645 is determined as the input value of the selected buffer. When "UPDATE" is low or the $b_{k-3-n}$ value is 0, the original tap value is maintained.

According to FIG. 7, the structure of an embodiment of the first filter tap $P_1$ having different tap values according to the patterns of data is as follows. The operation processes of the first filter tap $P_1$ are similar to those of the nth filter tap $P_n$(n=2 through N) shown in FIG. 6. However, the first filter tap $P_1$ outputs two values, i.e., $w_{k-1}(b_k=1)p_1$ and $w_{k-1}(b_k=0)p_1$. Here, the current time is based on k−1.

The buffers $p_1(i)$ (i=0, 1, . . . , $2^{\tau+1}-1$) store the tap values with respect to the respective patterns. An initial value is designated as $p_1(i)$ (wherein, i=0, 1, . . . , $2^{\tau+1}-1$) when a control signal "LOAD" is turned on in an initial stage of the operation. Reference numerals 700 and 705 respectively denote the 0th buffer and the $2^{\tau+}-1$th buffer.

In the present embodiment, the tap value selecting means 510 of FIG. 5 includes a lower tap value selecting multiplexer 710 and an upper tap value selecting multiplexer 715.

The lower tap selecting multiplexer 710 selects one among the lower $2^\tau$ buffer values $p_1(i)$ (i=0, 1, . . . , $2^{\tau+1}-1$) by the past τ bit transition patterns $b_{k-2:k-\tau-1}$. The upper tap value selecting multiplexer 715 selects one among the upper $2^\tau$ buffer values $p_1(i)$ (i=$2^\tau$, . . . , $2^{\tau+1}-1$).

The output value of the lower tap value selecting multiplexer 710 relates to the tap value when $b_k$=0. The output value of the upper tap value multiplexer 715 relates to the tap value when $b_k$=1.

In the present embodiment, the current transition multiplier 520 of FIG. 5 includes a lower tap value current transition multiplier 720 and an upper tap value current transition multiplier 725.

The lower tap value current transition multiplier 720 and the upper tap value current transition multiplier 725 include code selectors 721 and 726 and current transition presence selectors 722 and 727. The operation of the lower tap value current transition multiplier and the upper tap value current transition multiplier are the same as multiplying the output values of the lower tap value selecting multiplexer 710 and the upper tap value selecting multiplexer 715 with $x_{k-1}$. Namely, the output values of the current transition presence selectors 722 and 727 are $w_{k-1}(b_k=1)p_1$ and $w_{k-1}(b_k=0)p_1$, which are the output values of the first filter tap $P_1$.

Figure 6:
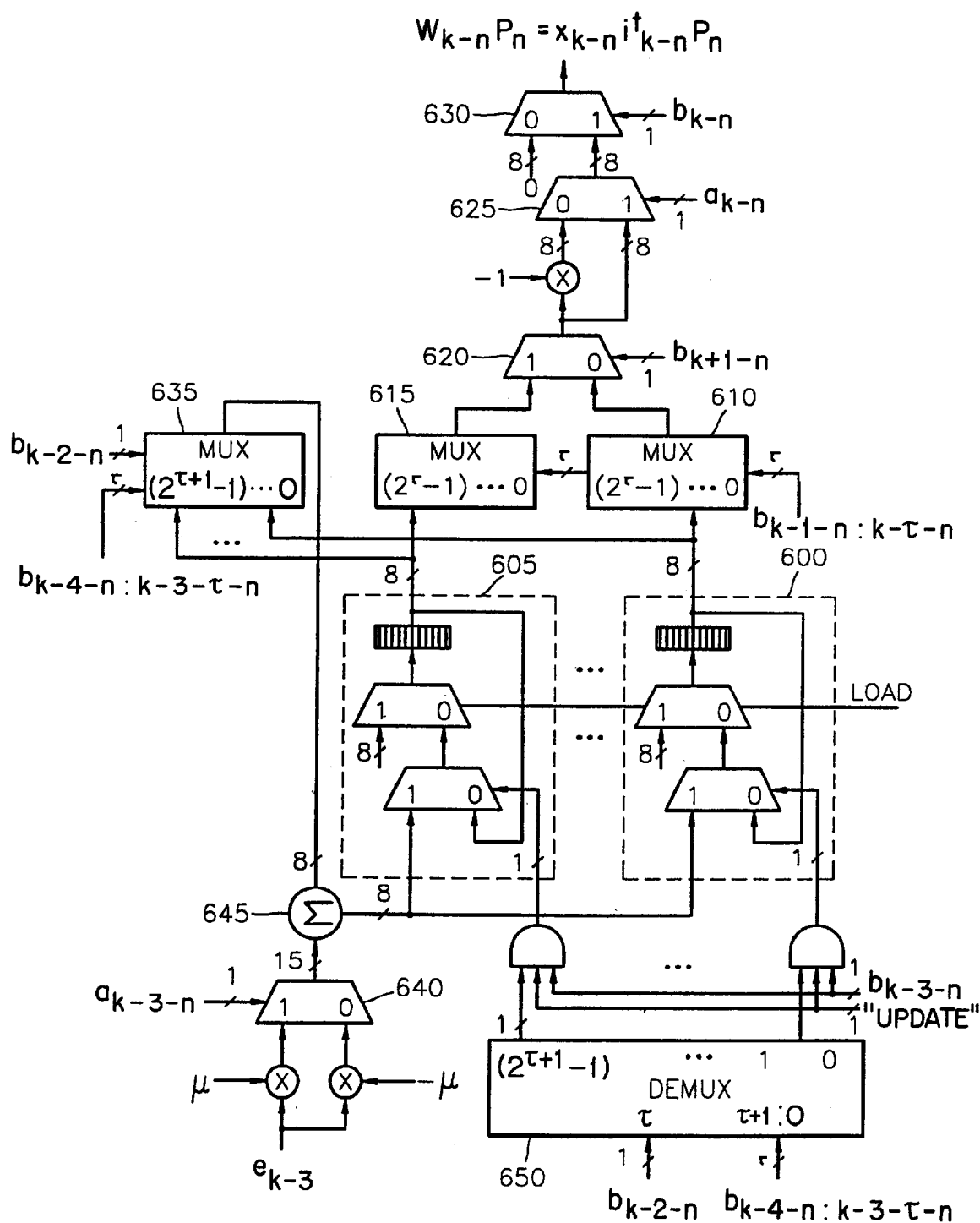
FIG. 6 shows an embodiment (n=2, 3, . . . , and N) of a number n filter tap ($P_n$) of the pattern dependent filter of FIG. 5 having filter tap values which vary according to data patterns.
Figure 7:
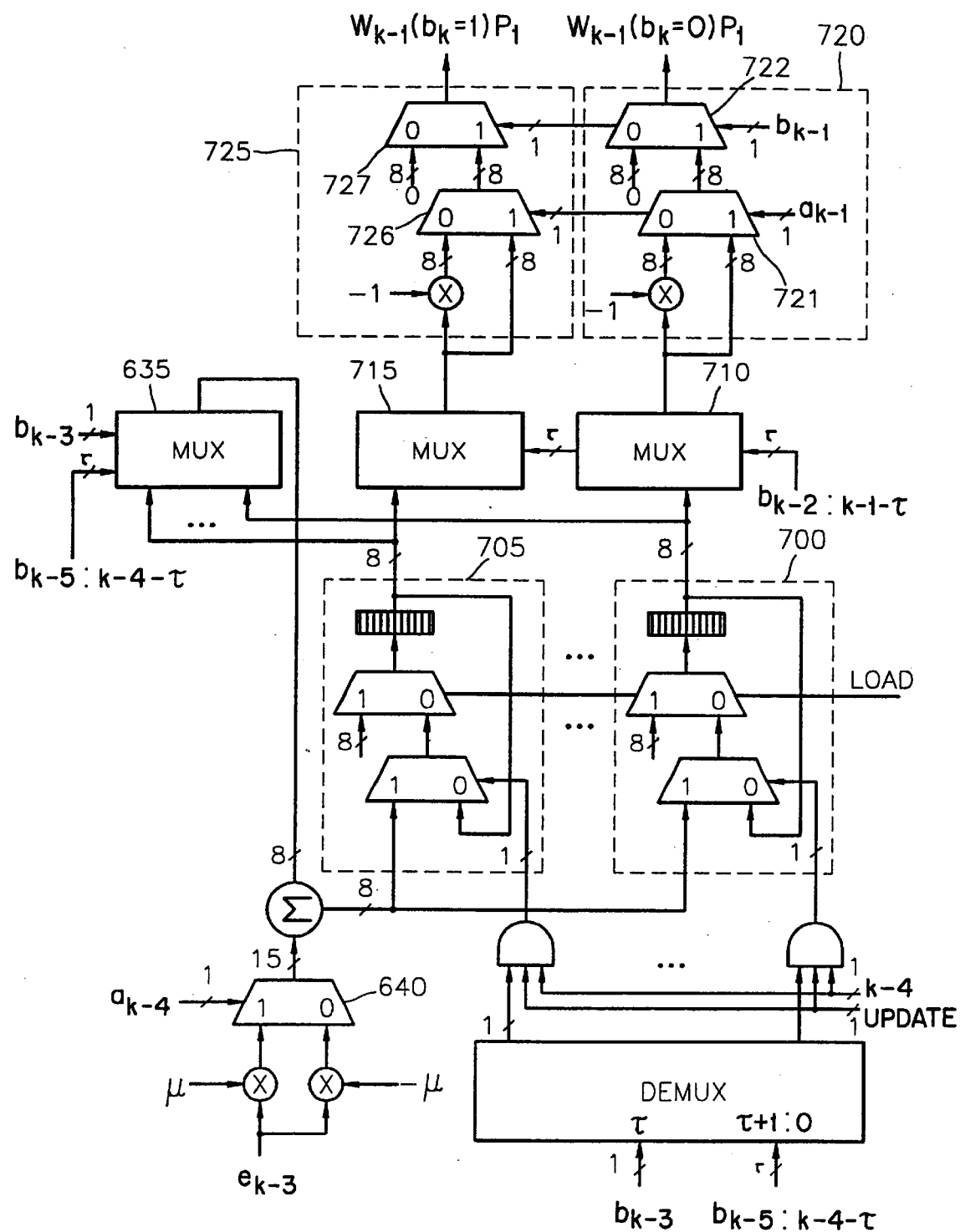
FIG. 7 is an embodiment of a number 1 filter tap ($P_1$) of the pattern dependent filter of FIG. 5 having the filter tap values which vary according to the data patterns.

Processes of renewing the tap value using the error value $e_{k-3}$ by the first filter tap $P_1$ are the same as shown in FIG. 6.

Figure 8:
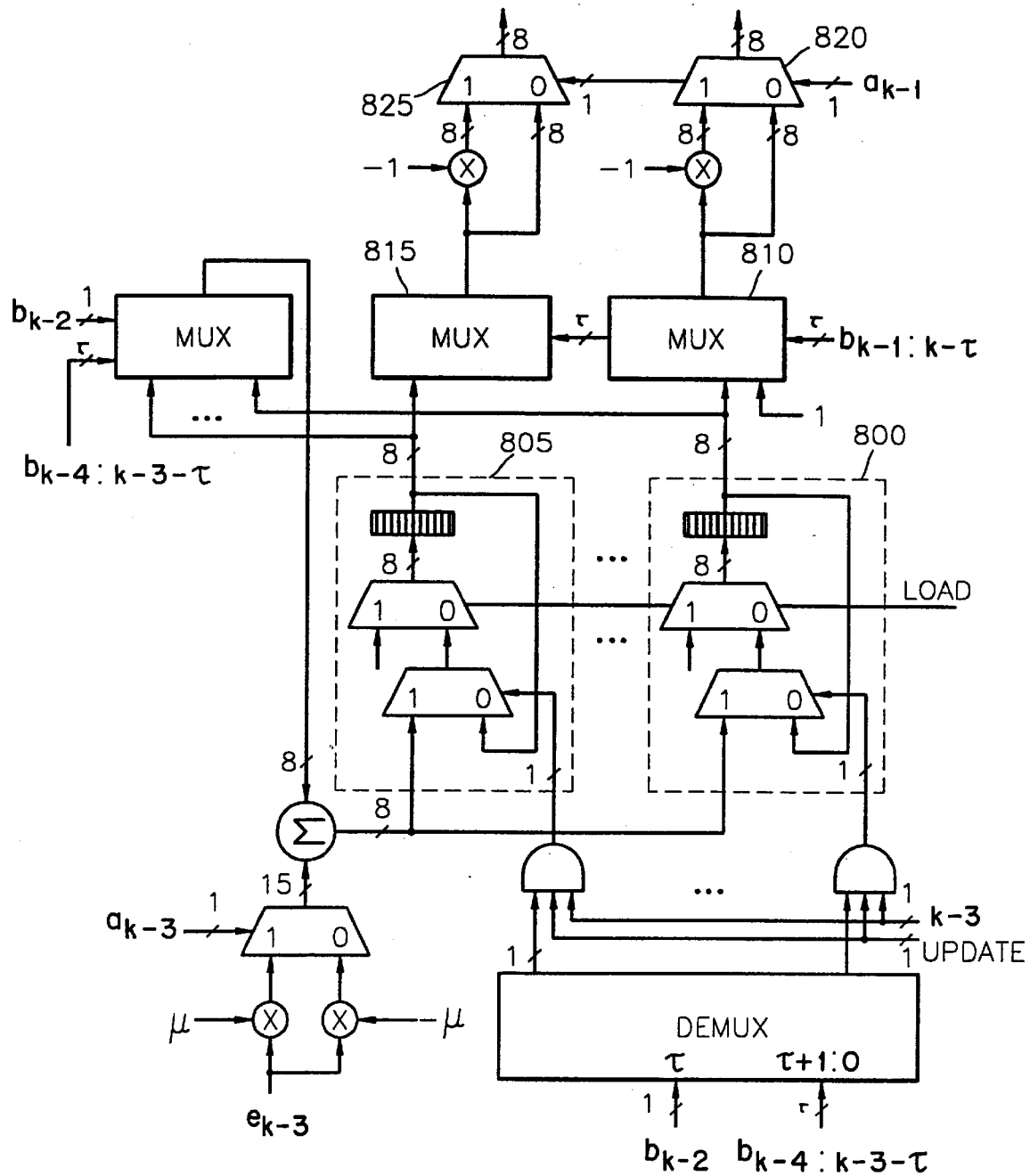
FIG. 8 is an embodiment of a number 0 filter tap ($P_0$) of the pattern dependent filter of FIG. 5 having the filter tap values which vary according to the data patterns.

According to FIG. 8, the structure of an embodiment of the 0th filter tap $P_0$ having different tap values according the patterns of data is as follows. The operating processes of the 0th filter tap $P_0$ are similar to those of the nth filter tap $P_n$ (n=2 through N) shown in FIG. 6. However, the 0th filter tap $P_0$ outputs the two values, i.e., $w_k(b_k=1,b_{k+1}=1)p_0$ and $w_k(b_k=1,b_{k+1}=0)p_0$. Here, the current time is based on k.

The buffers $p_0(z)$ (i=1, ..., $m_0$-1, $m_0$+1, ..., $2^{\tau+1}$-1) store the tap values with respect to the respective patterns. The 0th tap value $p_0(m_0)$ is fixed to 1. $m_0$ is a certain fixed value selected from the values, 0 through $2^{\tau+1}$-1. An initial value is designated as $p_0(i)$ (wherein, i=1, ..., $m_0$-1, $m_0$+1, ..., $2^{\tau+1}$-1) when the control signal "LOAD" is turned on in an initial stage of the operation. FIG. 8 shows an embodiment realized by selecting $m_0$=0. Reference numerals 800 and 805 respectively denote a first buffer and a ($2^{\tau+1}$-1)th buffer.

In the present embodiment, the tap value selecting means 510 of FIG. 5 includes a lower tap value selecting multiplexer 810 and an upper tap value selecting multiplexer 815.

The lower tap value selecting multiplexer 810 selects one among the lower $2^\tau$ tap values $p_0(i)$ (i=0, 1, ..., $2^\tau$-1) by the pattern ($b_{k-1:k-\tau}$) of the past τ bit transition absolute value. The upper tap value selecting multiplexer 815 selects one among the upper $2^\tau$ tap values $p_0(i)$ (i=$2^\tau$, ..., $2^{\tau+1}$-1) by the pattern ($b_{k-1:k-\tau}$) of the past τ bit transition absolute values.

The output value of the lower tap value selecting multiplexer 810 relates to the tap value when $b_{k+1}$=0. The output of the upper tap value selecting multiplexer 815 relates to the tap value when $b_{k+1}$=1.

In the present invention, the current transition multiplier of FIG. 5 includes a lower tap value current transition multiplier 820 and an upper tap value current transition multiplier 825.

The lower tap value current transition multiplier 820 selects the output value of the lower tap value selecting multiplexer 810 when $a_{k-1}$=0 and the value obtained by multiplying -1 with the output value of the lower tap value selecting multiplexer 810. The upper tap value current transition multiplier 825 selects the output value of the upper tap value selecting multiplexer 815 when $a_{k-1}$=0 and the value obtained by multiplying the output value of the upper tap value selecting multiplexer 815 with -1 when $a_{k-1}$=1. Namely, the lower tap value current transition multiplier 820 and the upper tap value current transition multiplier 825 perform the same operation as that of multiplying $x_k$ when it is assumed that $b_k$=1 with the output values of the lower tap value selecting multiplexer 810 and the upper tap value selecting multiplexer 815. Therefore, the lower tap value current transition multiplier 820 and the upper tap value current transition multiplier 825 respectively output $w_k(b_k=1,b_{k+1}=1)p_0$ and $w_k(b_k=1,b_{k+1}=0)p_0$.

Processes of renewing the tap values using the error value $e_{k-3}$ by the 0th filter tap $P_0$ are the same as those of FIG. 6.

Channel data for testing the performance of the present invention is generated as follows. The channel signal $r_k$ with respect to the binary data $a_k$=(+1, -1) and $x_k$=($a_k$-$a_{k-1}$)/2 obtained by encoding a random binary data sequence to RLL(0,4/4) has a shape in which the gain $g_k$ and the phase $\epsilon_k$ of the pulse h(t) are affected by data and white gaussian noise $n_k$ is added.

$$r_k = \sum_{m=-N}^{N} x_{k-m} g_{k-m} h(mT + \epsilon_{k-m}) + n_k \qquad (29)$$

wherein, the pulse h(t) is $$h(t)=[1+(2t/pw_{50})^2]^{-1} \qquad (30)$$

wherein, $pw_{50}$ designates the value of 2.5×(9/8). The size of the noise is defined as follows.

$$SNR_{mfb}=E\{[h(kT)-h(kT-T)]^2\}/E\{n^2_k\} \qquad (31)$$

TABLE 1

| gain change (γ = 0.6) | | |
|---|---|---|
| $b_{k-1}$ | $b_{k+1}$ | $g_k$ |
| 0 | 0 | 1 |
| 0 | 1 | γ |
| 1 | 0 | γ |
| 1 | 1 | $γ^2$ |

TABLE 2

| pulse phase change | | |
|---|---|---|
| $b_{k-2}$ | $b_{k-1}$ | $\epsilon_k/T$ |
| 0 | 0 | 0 |
| 0 | 1 | 0.5 |
| 1 | 0 | 0.125 |
| 1 | 1 | 0.375 |

Figure 9:
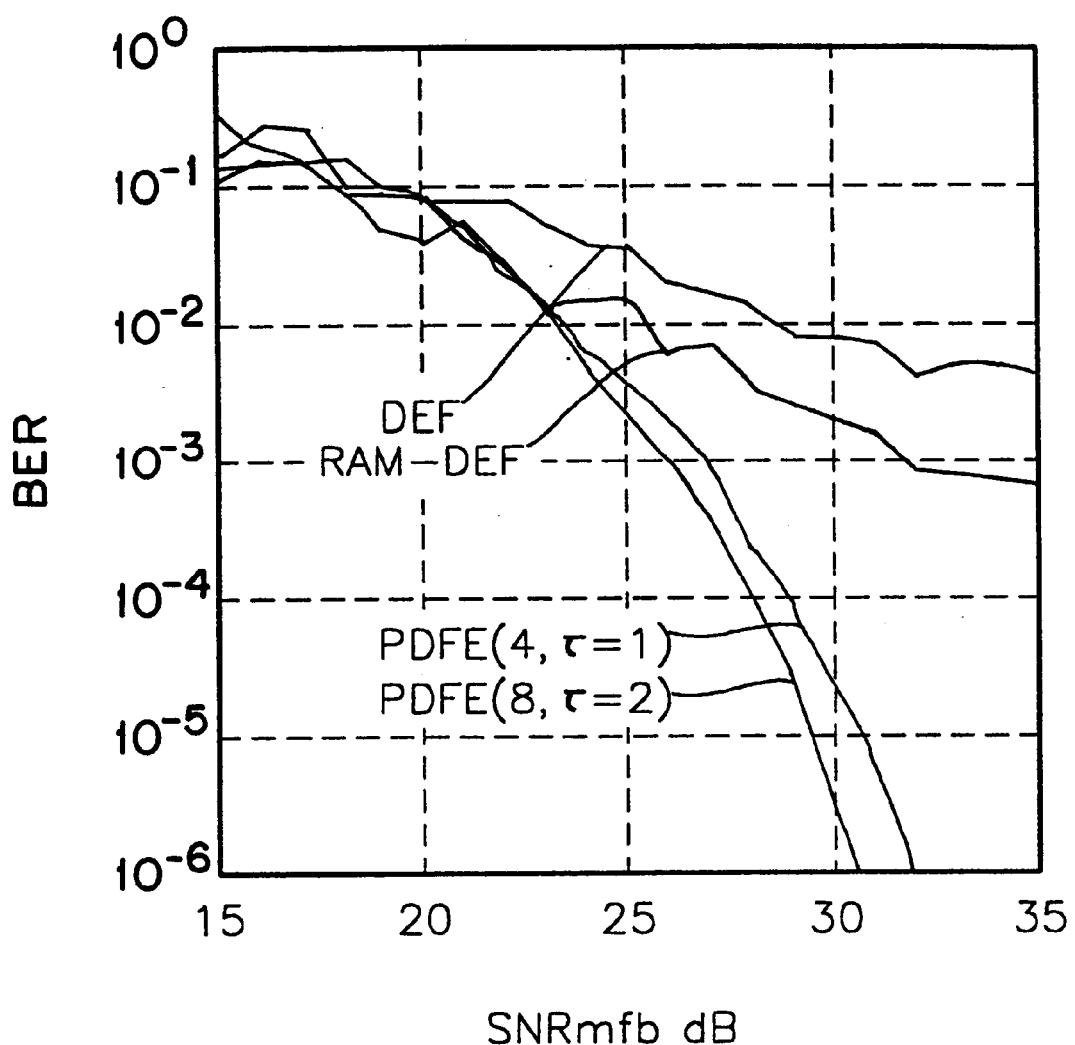
FIG. 9 is a graph for comparing the performance of a conventional equalizer with that of an equalizer according to the present invention.

In FIG. 9, the performance of a bit-error-rate (BER) of a conventional linear decision-feedback equalizer and a RAM-decision-feedback equalizer when τ=1 is compared with that when τ=2. Predictive DFE (4, τ=1) means that the respective filter taps four different values and are selected by the data value of future 1 bit and past 1 bit. Predictive DFE (8, τ=2) means that the respective filter taps have eight different values and are selected by the data value of future 1 bit and past 2 bits. According to FIG. 9, the performance of the present invention is much better than that of the conventional method.

According to the present invention, it is possible to effectively display the nonlinear distortion of the digital magnetic storing channel generated by the interaction between adjacent data and to remarkably reduce the modeling error compared with a conventional model in which the influence of the future bit cannot be considered, by displaying the nonlinear channel of a high density digital magnetic storing apparatus as transition pulses selected according to the pattern of the transition absolute value of the future v bits and the past T bits.

The model on which the present invention is based is mathematically induced. Accordingly, it is possible to obtain an optimized modeling error and to trade off performance and complexity of the desired model and equalizer in a given channel by appropriately selecting the v and τ values of the model.

In the model on which the present invention is based, when the v value is larger than 1, it is possible to detect the current data only after detecting the current and the v future data. When v=1, the current data can be easily realized by the threshold value detector on the basis of 0, using the characteristics of the channel and the model.

Also, the nonlinear equalizer according to the present invention is completely adaptively realized.

What is claimed is:

1. A nonlinear equalizing apparatus for detecting original data $a_k$ from an input value $r_k$ obtained by reproducing data received through a transfer channel or recorded on a storing apparatus, comprising:

a linear filter for linear filtering the input value $r_k$;

a pattern dependent filter including $2^{\tau+v}$ tap values selected by the respective patterns $(b_{k-n+v:k-n+1}, b_{k-n-1:k-n-\tau})$ of future v and past τ bit data transition absolute values and N taps $p_n(b_{k-n+v:k-n+1}, b_{k-n-1:k-n-\tau})$ for outputting the value obtained by multiplying the selected tap value with the current transition $(x_{k-n})$; and (wherein, $x_{k-n}=(a_{k-n}-a_{k-n-1})/2 \in \{-1, 0, \}$, $b_{k-n}=|x_{k-n}| \in \{0, 1\}$, $b_{k-n-1:k-n-\tau}=(b_{k-n-1} \ b_{k-n-2} \ldots b_{k-n-\tau})$, $b_{k-n+v:k-n+1}=(b_{k-n+v} \ b_{k-n+v-1} \ldots b_{k-n+1})$, n=0, 1, 2, ..., N, and N is a predetermined integer not less than 1+v)

a detector for obtaining an error value $e_k$ by a subsequent equation, with respect to all combinations of current and future data sequences $$e_k = \sum_m r_{k-m} f_m - \sum_n x_{k-n} p_n(b_{k-n+v:k-n+1}, b_{k-n-1:k-n-\tau})$$

(wherein, $f_m$ is the linear filter) and detecting current data assumed in the combination by which the minimum error square value is generated as the original data $a_k$.

2. The apparatus of claim 1, wherein the pattern dependent filter comprises:

a 0th filter tap including $2^{\tau+1}$ tap values selected by the pattern $(b_{k+1}, b_{k-1:k-\tau})$ of future one and past τ bit data transition absolute values from a reference time when the reference time is k, for selecting a tap value obtained by assuming current and future transition absolute values as $(b_k=1, b_{k+1}=0)$ and $(b_k=1, b_{k+1}=1)$, multiplying the respective selected tap values with the current transition $x_k$, and outputting the result;

a first filter tap including $2^{\tau+1}$ tap values selected by the pattern $(b_k, b_{k-2:k-1-\tau})$ of future one and past τ bit data transition absolute values from a reference time when the reference time is k-1, for selecting a tap value obtained by assuming future transition absolute values as $(b_k=1)$ and $(b_k=0)$, multiplying the respective selected tap values with the current transition $x_{k-1}$, and outputting the result;

second through Nth filter taps including $2^{\tau+1}$ tap values selected by the pattern $(b_{k+1-n}, b_{k-1-n:k-\tau-n})$ of future one and past τ bit data transition absolute values from a reference time when the reference time is k-n, for multiplying the respective selected tap values with the current transition $x_{k-n}$, and outputting the result, wherein n=2, ..., N and N is a predetermined integer equal to or greater than 2; and a transition calculator for calculating data $a_{k-1}$ delayed by one clock cycle and a transition absolute value $b_{k-1}$ used for the 0th filter tap through the Nth filter tap, from the original data $a_k$ detected by the detector, wherein the detector comprises:

a past tap value adder for adding the output values of the second filter tap through the Nth filter tap to each other;

a future tap value adder for adding the output value of the 0th filter tap obtained by assuming that $b_k=b_{k+1}=1$, the output value of the first filter tap obtained by assuming that $b_k=0$, and the output value of the first filter tap obtained by assuming that $b_k=1$ to each other; and a threshold value calculator for detecting a threshold value based on 0 from the value obtained by subtracting the output value of the past tap value adder from the output value of the linear filter and subtracting the value obtained by multiplying the output value of the future tap value adder with ½ from the result and outputting the threshold value.

3. The apparatus of claim 2, wherein the pattern dependent filter further comprises an error value calculator for calculating an error value $e_{k-3}$ delayed by three clock cycles by subtracting the value selected by $b_{k-1}$ by delaying the two output values of the first filter tap by one clock from the value $z_k$ obtained by subtracting the output value of the past tap value adder from the output value of the linear filter, subtracting the value selected by $b_{k-1}$ and $b_{k-2}$ by delaying the two output values of the 0th filter tap by two clock cycles from the subtraction result, and delaying the result by one clock cycle, wherein the 0th through Nth filter taps correct the tap value corresponding to the transition absolute value pattern by the error value delayed by three clock cycles calculated by the error value calculator.

4. The apparatus of claim 3, wherein the error value calculator of the pattern dependent filter constructed by a pipeline calculates the error value $e_{k-3}$ delayed by three clocks cycle.

5. The apparatus of claim 4, wherein the error value calculator comprises:

a first filter tap value selector for delaying the two output values of the first filter tap by one clock cycle and selecting the output value obtained by assuming $b_k=0$ when $b_{k-1}=0$ and the output value obtained by assuming $b_k=1$ when $b_{k-1}=1$;

a second filter tap value selector for delaying the two output values of the 0th filter tap by two clock cycles and selecting the output value obtained by assuming $b_{k+1}=0$ when $b_{k-1}=0$ and the output value obtained by assuming $b_{k+1}=1$ when $b_{k-1}=1$;

a third filter tap value selector for selecting 0 when $b_{k-2}=0$ and the value selected by the second filter tap value selector when $b_{k-2}=1$;

a first error value adder for delaying the value $z_k$ obtained by subtracting the output value of the past tap value adder from the output value of the linear filter by one clock cycle and subtracting the value selected by the first filter tap value selector from $z_k$ delayed by one clock cycle; and a second error value adder for calculating the error value $e_{k-3}$ delayed by three clock cycles by delaying the output value of the error value first adder by one clock cycle, subtracting the value selected by the third filter tap value selector from the output value of the error value first adder delayed by one clock cycle, and delaying the subtraction result by one clock cycle.

6. The apparatus of claim 2, wherein the transition calculator of the pattern dependent filter comprises:

first delaying means for delaying the original data $a_k$ detected by the detector by one clock;

an exclusive-OR gate for performing an exclusive-OR operation on the original data $a_k$ and the original data $a_{k-1}$ delayed by one clock cycle by the first delaying means; and second delaying means for calculating a transition absolute value $b_{k-1}$ delayed by one clock cycle by delaying the output of the exclusive-OR gate by one clock cycle.

7. A nonlinear equalizing apparatus for detecting an original data $a_k$ from an input value $r_k$ obtained by reproducing data received through a transfer channel or recorded on a storing apparatus, comprising:

a linear filter for linear filtering the input value $r_k$;

a pattern dependent filter including $2^{\tau+v+1}$ tap values selected by the respective patterns $(b_{k-n+v:k-n+1}, b_{k-n-1:k-n-\tau})$ of the future v, the current one, and the past τ data transition absolute values and N taps $p_n(b_{k-n+v:k-n+1}, b_{k-n-1:k-n-\tau})$ for outputting the value obtained by multiplying the selected tap value with the current transition $(x_{k-n})$, wherein $x_{k-n}=(a_{k-n}-a_{k-n-1})/2 \in \{-1, 0, 1\}$, $b_{k-n}=|x_{k-n}| \in \{0, 1\}$, $b_{k-n-1:k-n-\tau}=(b_{k-n-1}\ b_{k-n-2} \ldots b_{k-n-\tau})$, $b_{k-n+v:k-n+1}=(b_{k-n+v}\ b_{k-n+v-1} \ldots b_{k-n+1})$, $c_{k-n}$ equals 1 when $a_k>0$ and equals 0 in the other cases, $n=0, 1, 2, \ldots, N$, and N is a predetermined integer not less than 1+v; and a detector for obtaining an error value $e_k$ by the subsequent equation, with respect to all combinations of current and future data sequences $$e_k = \sum_m r_{k-m} f_m - \sum_n x_{k-n} p_n(b_{k-n+v:k-n+1}, c_{k-n}, b_{k-n-1:k-n-\tau}),$$

wherein $f_m$ is the linear filter, and detecting current data assumed in the combination by which the minimum error square value is generated as the original data $a_k$.

8. The apparatus of claim 7, wherein the pattern dependent filter comprises:

a 0th filter tap including $2^{\tau+2}$ tap values selected by the pattern $(b_{k+1}, c_k, b_{k-1:k-\tau})$ of future one and past τ bit data transition absolute values from a reference time when the reference time is k, for selecting a tap value obtained by assuming current and future transition absolute values as $(b_k=1, b_{k+1}=0)$ and $(b_k=1, b_{k+1}=1)$, multiplying the respective selected tap values with the current transition $x_k$, and outputting the result;

a first filter tap including $2^{\tau+2}$ tap values selected by the pattern $(b_k, c_{k-1}, b_{k-2:k-\tau})$ of future one and past τ bit data transition absolute values from a reference time when the reference time is k−1, for selecting a tap value obtained by assuming future transition absolute values as $(b_k=1)$ and $(b_k=0)$, multiplying the respective selected tap values with the current transition $x_{k-1}$, and outputting the result;

second through Nth filter taps including $2^{\tau+2}$ tap values selected by the pattern $(b_{k+1-n}, c_{k-n}, b_{k-1-n:k-\tau-n})$ of future one and past τ bit data transition absolute values from a reference time when the reference time is k−n, for multiplying the respective selected tap values with the current transition $x_{k-n}$, and outputting the result, wherein $n=2, \ldots,$ and N and N is a predetermined integer at least 2; and a transition calculator for calculating data $a_{k-1}$ delayed by one clock cycle and a transition absolute value $b_{k-1}$ used for the 0th filter tap through the Nth filter tap, from the original data $a_k$ detected by the detector, wherein the detector comprises:

a past tap value adder for adding the output values of the second filter tap through the Nth filter tap to each other;

a future tap value adder for adding the output value of the 0th filter tap obtained by assuming that $b_k=b_{k+1}=1$, the output value of the first filter tap obtained by assuming that $b_k=0$, and the output value of the first filter tap obtained by assuming that $b_k=1$ to each other; and a threshold value calculator for detecting a threshold value based on 0 from the value obtained by subtracting the output value of the past tap value adder from the output value of the linear filter and subtracting the output value of the future tap value adder from the result and outputting the threshold value.

9. A method of detecting original data $a_k$ from an input value $r_k$ obtained by reproducing data received through a transfer channel or recorded on a storing apparatus, comprising the steps of:

obtaining $$\sum_n r_{k-n} f_n$$

by linear filtering the input value $r_k$;

obtaining $$z_k = \sum_n r_{k-n} f_n - \sum_{n=2}^{N} x_{k-n} p_n(b_{k-n+1}, b_{k-n-1:k-n-\tau})$$

from already known data when a filter tap including $2^{\tau+1}$ tap values selected by the pattern $(b_{k+1-n}, b_{k-1-n:k-\tau-n})$ of the future one and past τ bit data transition absolute values from a reference time when the reference time is k−n for multiplying the selected tap value with the current transition $x_{k-n}$ is $p_n(b_{k-n+1}, b_{k-n-1:k-n-\tau})$, wherein $x_{k-n}=(a_{k-n}-a_{k-n-1})/2 \in \{-1, 0, 1\}$, $b_{k-n}=|x_{k-n}| \in \{0, 1\}$, $b_{k-n-1:k-n-\tau}=(b_{k-n-1}\ b_{k-n-2} \ldots b_{k-n-\tau})$, $n=0, 1, 2, \ldots, N$, and N is a predetermined integer not less than $2^v$;

obtaining an intermediate value $T_k$ between the output value of the filter tap $p_1$ and $p_0$ when the transition is continuously generated in the current and future one bit $(b_k=b_{k+1}=1)$ and the output value of the filter tap $p_1$ and $p_0$ when the transition is not currently generated; and detecting the original data $a_k$ by determining $a_k$ as +1 when $z_k - T_k$ is equal to or greater than 0 and as −1 when $a_k$ is less than 0.

10. A method of detecting original data $a_k$ from an input value $r_k$ obtained by reproducing data received through a transfer channel or recorded on a storing apparatus, comprising the steps of:

obtaining $$\sum_n r_{k-n} f_n$$

by linear filtering the input value $r_k$;

obtaining $$z_k = \sum_n r_{k-n} f_n - \sum_{n=2}^{N} x_{k-n} p_n(b_{k-n+1}, c_{k-n}, b_{k-n-1:k-n-\tau})$$

from already known data when a filter tap including $2^{\tau+2}$ tap values selected by the pattern $(b_{k+1-n}, c_{k-n}, b_{k-1-n:k-\tau-n})$ of the future one, current one, and past τ data transition absolute values from a reference time when the reference time is k−n for multiplying the selected tap value with the current transitions $x_{k-n}$ is $p_n(b_{k-n+1}, c_{k-n}, b_{k-n-1:k-n-\tau})$, wherein, $x_{k-n}=(a_{k-n}-a_{k-n-1})/2 \in \{-1, 0, 1\}$, $b_{k-n}=|x_{k-n}| \in \{0, 1\}$, $b_{k-n-1:k-n-\tau}=(b_{k-n-1}\ b_{k-n-2} \ldots b_{k-n-\tau})$, $c_{k-n}$ equals to 1 when $a_k>0$ and equals 0 in the other cases, $n=0, 1, 2, \ldots, N$, and N is a predetermined integer not less than $2^v$;

obtaining an intermediate value $T_k$ between the output value of the filter tap $P_1$ and $p_0$ when the transition is continuously generated in the current and future one bit ($b_k=b_{k+1}=1$) and the output value of the filter tap $p_1$ and $p_0$ when the transition is not currently generated; and detecting the original data $a_k$ by determining $a_k$ as +1 when $z_k-T_k$ equals to or is larger than 0 and as −1 when $a_k$ is less than 0.

* * * * *